(12) United States Patent
Jiang et al.

(10) Patent No.: US 7,884,019 B2
(45) Date of Patent: Feb. 8, 2011

(54) POISON-FREE AND LOW ULK DAMAGE INTEGRATION SCHEME FOR DAMASCENE INTERCONNECTS

(75) Inventors: Ping Jiang, Plano, TX (US); William W. Dostalik, Plano, TX (US); Yong Seok Choi, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/759,451

(22) Filed: Jun. 7, 2007

(65) Prior Publication Data

US 2008/0305625 A1 Dec. 11, 2008

(51) Int. Cl.
*H01L 21/44* (2006.01)
*H01L 21/4763* (2006.01)

(52) U.S. Cl. ................ 438/687; 438/637; 438/666; 257/E21.579; 257/E21.577

(58) Field of Classification Search ................ 438/687
See application file for complete search history.

(56) References Cited

U.S. PATENT DOCUMENTS

| | | | | |
|---|---|---|---|---|
| 6,284,149 B1 * | 9/2001 | Li et al. | ................ | 216/64 |
| 6,350,675 B1 * | 2/2002 | Chooi et al. | ................ | 438/624 |
| 6,350,700 B1 * | 2/2002 | Schinella et al. | ................ | 438/723 |
| 6,627,540 B2 * | 9/2003 | Lee | ................ | 438/638 |
| 6,815,333 B2 * | 11/2004 | Townsend et al. | ................ | 438/623 |
| 7,078,348 B1 * | 7/2006 | Singh et al. | ................ | 438/700 |
| 7,354,859 B2 * | 4/2008 | Nagase | ................ | 438/687 |
| 7,435,685 B2 * | 10/2008 | Delgadino et al. | ................ | 438/700 |
| 2002/0008323 A1 * | 1/2002 | Watanabe et al. | ................ | 257/758 |
| 2003/0008490 A1 | 1/2003 | Xing et al. | | |
| 2003/0119307 A1 * | 6/2003 | Bekiaris et al. | ................ | 438/638 |
| 2004/0067634 A1 | 4/2004 | Kim et al. | | |
| 2005/0191855 A1 * | 9/2005 | Chen et al. | ................ | 438/687 |
| 2005/0245075 A1 * | 11/2005 | Arita et al. | ................ | 438/638 |
| 2006/0163730 A1 * | 7/2006 | Matsumoto et al. | ................ | 257/751 |
| 2006/0216946 A1 * | 9/2006 | Usami et al. | ................ | 438/763 |
| 2007/0082477 A1 * | 4/2007 | Naik et al. | ................ | 438/622 |
| 2007/0134917 A1 * | 6/2007 | Li et al. | ................ | 438/637 |

FOREIGN PATENT DOCUMENTS

JP 2004241620 8/2004

* cited by examiner

*Primary Examiner*—Scott B Geyer
*Assistant Examiner*—Pape Sene
(74) *Attorney, Agent, or Firm*—Warren L. Franz; Wade J. Brady, III; Frederick J. Telecky, Jr.

(57) ABSTRACT

A method of forming a dual-damascene structure is disclosed. A lower dielectric hardmask layer and an upper dielectric hardmask layer are deposited on an ultra low-k film. A first via is formed in the upper hardmask layer. Next, a first trench is formed using the tri-layer resist scheme. Finally, a full via and a full trench are formed simultaneously. An optional etch-stop layer can be used in the ultra low-k layer to control trench depth.

19 Claims, 4 Drawing Sheets

POISON-FREE AND LOW ULK DAMAGE INTEGRATION SCHEME FOR DAMASCENE INTERCONNECTS

FIELD

The subject matter of the teachings disclosed herein relates to a method of forming back-end-of-line (BEOL) trench and via dual damascene features associated with the manufacture of integrated circuits. More particularly, the subject matter of the teachings disclosed herein relates to a method of forming small geometry dual damascene features that uses tri-layer resist, eliminates resist poisoning and minimizes ultra low-k damage due to etch and ash processes.

BACKGROUND

The integrated circuit (IC) industry has seen enormous performance improvements and miniaturization in the past few decades through scaling of IC feature sizes. A primary contribution to the IC performance improvement has come from the device gate level. However, as device scaling continues into the deep-sub-micron region, metal interconnects become the bottleneck for continued IC performance improvement. The gain in device speed at the gate level is offset by propagation delays at the metal interconnect due to the increased RC time constant. The RC time delay can be reduced by the incorporation of low dielectric constant (k) materials and/or high conductivity metals. The use of low-k dielectric materials also lowers power consumption and reduces crosstalk.

Continuous scaling of devices will require the use of ultra low k (ULK) materials. Incorporation of air into dense materials to make them porous is an attractive method to obtain ULK materials. With the introduction of ULK materials (e.g., k<2.5) to the 45 nm technology node, a new challenge comes from ULK film damage due to etch and ash processes. The ULK sidewall damage observed can be as high as 20-30 nm per side of trench or via features. This is a significant issue in meeting the 45 nm trench or via specifications (<2 nm per side). Minimizing the exposure of ULK film to ash and etch processes is required to reduce the ULK damage.

A significant obstacle in Cu/low-k (or ULK) dual damascene via and trench patterning is resist pattern defects or resist poisoning. Resist poisoning occurs due to an interaction between a deep ultra-violet (DUV) resist and low-k/ULK films or etch-stop films (such as silicon nitride, silicon carbide). An integration scheme that eliminates poisoning is required.

A conventional dual hardmask integration uses trench-first scheme with single-layer resist for via and trench pattern. However, the trench-first dual hardmask scheme has issues with resist thinning and issues with depth-of-focus during subsequent via trench pattern due to the relatively large trench open area.

For the 45 nm technology and beyond, one of the biggest challenges is to provide minimum pitch resolution and descent depth of focus (DOF) through all the pattern pitches during photolithography. Due to resist collapse and scumming concern, resist thickness needs to be reduced to 150 nm or less for the 45 nm technology node. The 150 nm thick resist can not provide sufficient mask protection during trench and via etch. Therefore, additional robust mask layer is required. Metal hardmask is one of the options to improve hardmask selectivity. However, dielectric hardmask scheme is preferred over metal hardmask scheme since it eliminates the need for separate metal deposition and etch tools.

A tri-layer stack with resist on top of an SOG (spin on glass) layer and organic underlayer at the bottom is used to replace the conventional resist/BARC stack in order to provide good reflectivity control for lithography and a usable hard mask for etch. Once the top resist is patterned, the image can be transferred to SOG layer through oxide (SOG) etch, and the remaining SOG serves as the hardmask to etch the organic underlayer. Then the thick underlayer is used as mask for the low-k or ULK dielectric etch to form trench or via features.

Accordingly, the present teachings solve these and other problems related to resist poisoning and damage of ultra low-k materials by providing a via-first scheme with dual dielectric hardmask and tri-layer resist.

SUMMARY

A method of forming a dual-damascene structure is disclosed that includes depositing a dielectric barrier layer over at least one electrical conductor as a via etch-stop layer, a low-k dielectric layer, a lower dielectric hardmask layer and an upper dielectric hardmask layer. The lower dielectric hardmask layer is more etch selective than the upper dielectric hardmask layer. A first via is formed in the upper dielectric hardmask. A first trench is formed using a tri-layer resist scheme. A full via and a full trench are formed substantially simultaneously.

A method of forming a dual-damascene structure is disclosed that includes depositing a dielectric barrier layer over Cu, a first low-k layer, an intermediate thin trench etch-stop layer, a second low-k layer, a lower dielectric hardmask layer and an upper dielectric hardmask layer. The lower dielectric hardmask layer is disclosed as being more etch selective than the upper dielectric hardmask layer. A first via is formed in the upper dielectric hardmask. A first trench is formed using the tri-layer resist scheme. A full via and a full trench are formed substantially simultaneously using the intermediate trench etch-stop layer as trench etch-stop and the dielectric barrier layer as via etch-stop layer.

Additional advantages of the embodiments will be set forth in part in the description which follows, and in part will be obvious from the description, or may be learned by practice of the teachings disclosed herein. The advantages will be realized and attained by means of the elements and combinations particularly pointed out in the appended claims.

It is to be understood that both the foregoing general description and the following detailed description are exemplary and explanatory only and are not restrictive of the teachings, as claimed.

The accompanying drawings, which are incorporated in and constitute a part of this specification, illustrate embodiments of the teachings and together with the description, serve to explain the principles of the teachings disclosed herein.

DESCRIPTION OF THE EMBODIMENTS

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

As discussed above, a conventional trench-first dual hardmask scheme has been employed to form a trench feature through a multi-layer integrated circuit device. In contrast, the present teachings use a small open area at a surface, i.e., via-first scheme, that results in less resist thinning and less depth-of-focus issues during trench patterning. A SiON or SRN top hardmask layer that also serves as an inorganic anti-reflective coating allows trench patterning without use of BARC or tri-layer resist. An optional thin trench etch-stop layer, e.g., <100 A SiCN, can be used to greatly improve trench depth control.

The teachings disclosed herein eliminate resist poisoning. The teachings disclosed herein eliminate the need to use double E-stop layers, such as SICO as a top E-stop to block amine source from an SiCN film as a bottom E-stop. The teachings disclosed herein reduce ULK damage from etch and ash. The teachings disclosed herein rely on a single layer resist for via patterning that results in a significant cost savings. Moreover, the teachings disclosed herein result in higher throughput due to simultaneous etching of a trench and a via.

FIGS. 1A-1J show a series of steps for a poison-free low ULK damage scheme using a via-first dual hardmask to form a dual-damascene, in accordance with the principles of the present teachings.

Figure 1A:
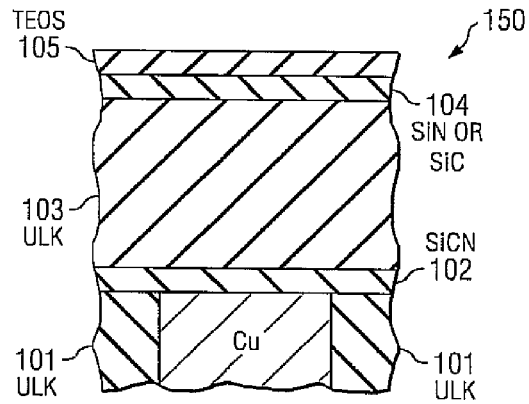
FIGS. 1A-1J show an embodiment for a poison-free low ULK damage scheme using a via-first dual hardmask to form a dual-damascene, in accordance with the principles of the present teachings.

FIG. 1A shows a first formation within a series of steps for a poison-free low ULK damage scheme using a via-first dual hardmask, in accordance with the principles of the present teachings.

In particular, integrated circuit stack 150 can be initially formed including a plurality of layers, e.g., a Cu/ULK layer 101, a SiCN layer 102, a ULK layer 103, a $Si_3N_4$ or SiC layer 104, and a Tetraethylorthosilicate (TEOS) layer 105.

Film deposition, e.g., chemical vapor deposition (CVD), can be used to deposit layers 102-105 over the Cu/ULK layer 101. The SiCN layer 102 can be used as an etch-stop layer or dielectric Cu barrier layer. The ULK layer 103 is an intra-metal dielectric (IMD)/interlevel dielectric (ILD) layer.

Figure 1B:
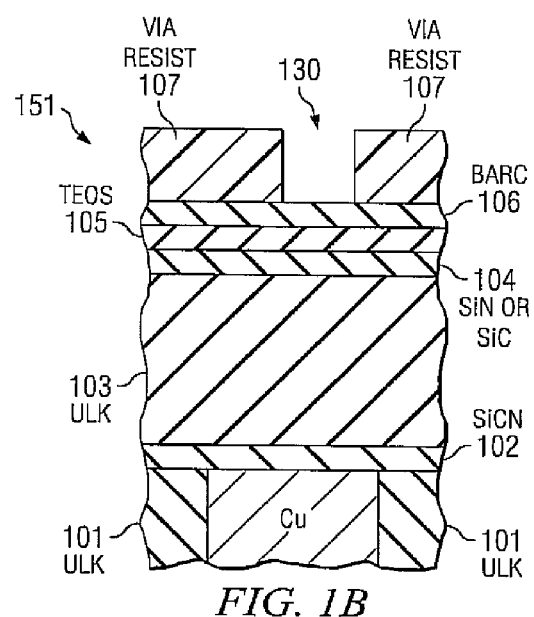

FIG. 1B shows a next formation from FIG. 1A within a series of steps for a poison-free low ULK damage scheme using a via-first dual hardmask, in accordance with the principles of the present teachings.

In particular, integrated circuit stack 151 can be formed including a plurality of layers, e.g., a Cu/ULK layer 101, a SiCN layer 102, a ULK layer 103, a $Si_3N_4$ or SiC layer 104, a TEOS layer 105, a BARC layer 106 and a resist layer 107.

BARC layer 106 and resist layer 107 are deposited over the integrated circuit stack 150 to form the integrated circuit stack 151. Moreover, the integrated circuit stack 151 is processed with conventional photolithography processing to produce a via 130 within resist layer 107.

Figure 1C:
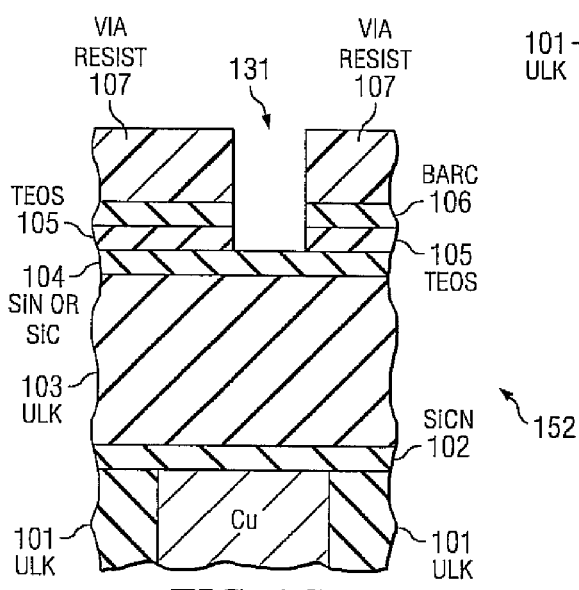

FIG. 1C shows a next formation from FIG. 1B within a series of steps for a poison-free low ULK damage scheme using a via-first dual hardmask, in accordance with the principles of the present teachings.

In particular, integrated circuit stack 152 can include a plurality of layers, e.g., a Cu/ULK layer 101, a SiCN layer 102, a ULK layer 103, a $Si_3N_4$ or SiC layer 104, a TEOS layer 105, a BARC layer 106 and a resist layer 107.

A via etch can be performed through plasma etching on integrated circuit stack 151. Via 130 can be extended down through BARC layer 106 and TEOS layer 105 resulting in the formation of via 131. First the BARC layer 106 is etched. Then, the top hardmask TEOS layer 105 is etched to stop selectively at or within the $Si_3N_4$ or SiC layer 104. The hardmask and etch process materials can be selected in order to stop the etch process on or within the hardmask $Si_3N_4$ or SiC layer 104.

Figure 1D:
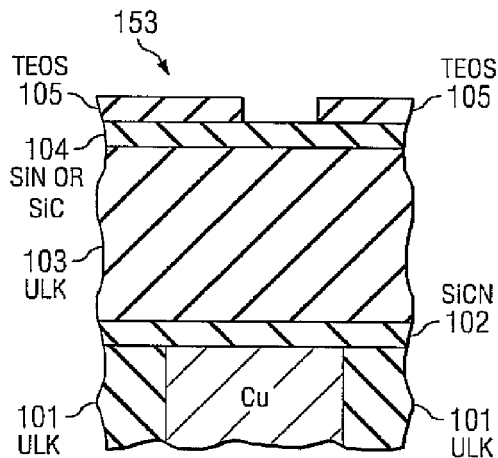

FIG. 1D shows a next formation from FIG. 1C within a series of steps for a poison-free low ULK damage scheme using a via-first dual hardmask, in accordance with the principles of the present teachings.

In particular, integrated circuit stack 153 can include a plurality of layers, e.g., a Cu/ULK layer 101, a SiCN layer 102, a ULK layer 103, a $Si_3N_4$ or SiC layer 104, and a TEOS layer 105.

An ash process can be performed on integrated circuit stack 152 to strip away resist layer 107 and BARC layer 106. The ash process can be performed on an etcher immediately after via etch performed in FIG. 1C. An optional wet clean process can be performed on the remaining integrated circuit stack.

Figure 1E:
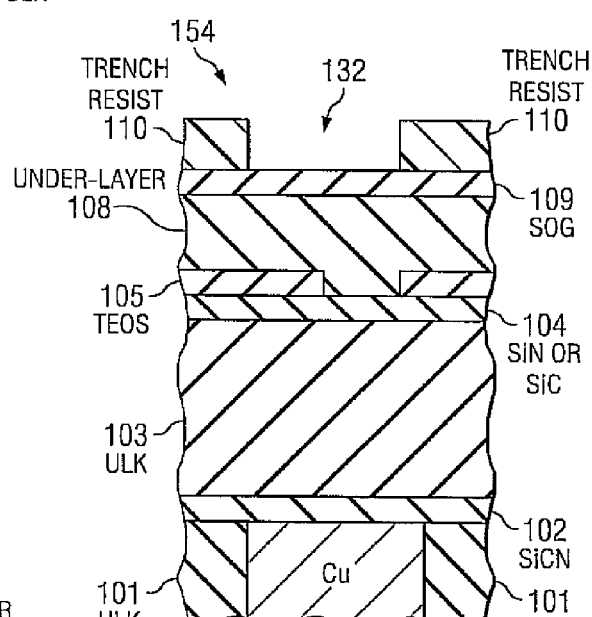

FIG. 1E shows a next formation from FIG. 1D within a series of steps for a poison-free low ULK damage scheme using a via-first dual hardmask, in accordance with the principles of the present teachings.

In particular, integrated circuit stack 154 can include a plurality of layers, e.g., a Cu/ULK layer 101, a SiCN layer 102, a ULK layer 103, a $Si_3N_4$ or SiC layer 104, a TEOS layer 105, an under-layer 108, a spin-on-glass (SOG) layer 109 and a resist layer 110.

Integrated circuit stack 153 is coated, e.g., CVD processing, to add the under-layer 108, the SOG layer 109 and resist layer 110. Trench 132 can be formed using conventional photolithography. The under-layer can be an organic film similar to resist.

Figure 1F:
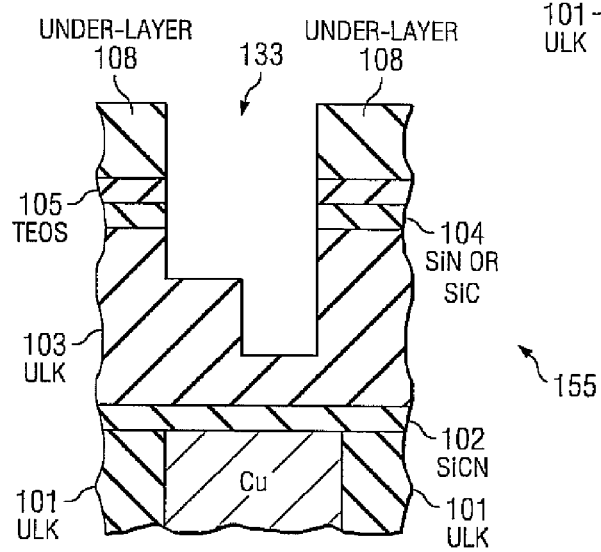

FIG. 1F shows a next formation from FIG. 1E within a series of steps for a poison-free low ULK damage scheme using a via-first dual hardmask, in accordance with the principles of the present teachings.

In particular, integrated circuit stack 155 can include a plurality of layers, e.g., a Cu/ULK layer 101, a SiCN layer 102, a ULK layer 103, a $Si_3N_4$ or SiC layer 104, a TEOS layer 105, and an under-layer 108. A via and trench 133 is formed through the Cu/ULK layer 101, the SiCN layer 102, and the ULK layer 103. The via 131 formed in FIG. 1C that created a via in TEOS layer 105 allows via and trench 133 to be formed with a via lower portion.

To create integrated circuit stack 155, first SOG layer 109 and under-layer 108 can be etched using, e.g., plasma etching, resulting in their removal. Next, a trench etch can be performed to simultaneously etch through the top hardmask, i.e., TEOS layer 105 and the bottom hardmask, i.e., $Si_3N_4$ or SiC layer 104, into the ULK layer 103. Next, the trench and via in the ULK layer 103 can be etched to form a partial trench and via 133 that are further processed below.

Figure 1G:
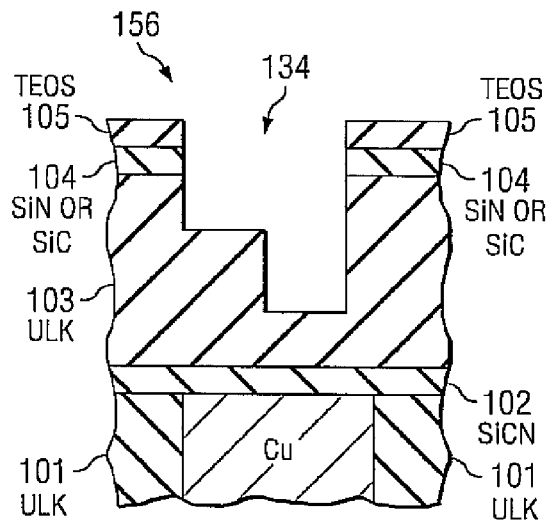

FIG. 1G shows a next formation from FIG. 1F within a series of steps for a poison-free low ULK damage scheme using a via-first dual hardmask, in accordance with the principles of the present teachings.

In particular, integrated circuit stack 156 can include a plurality of layers, e.g., a Cu/ULK layer 101, a SiCN layer 102, a ULK layer 103, a $Si_3N_4$ or SiC layer 104, and a TEOS layer 105. The under-layer 108 shown in FIG. 1F can be stripped away with an ash process that can be performed on an etcher immediately after the etching that was performed for FIG. 1F. An optional wet clean can be performed on the resulting integrated circuit stack 156 to remove any remaining residues.

Figure 1H:
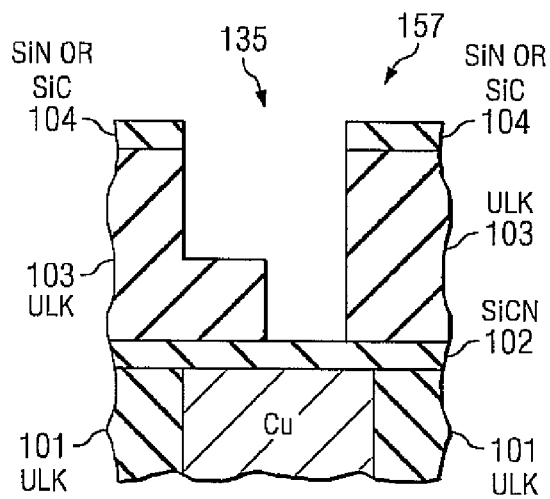

FIG. 1H shows a next formation from FIG. 1G within a series of steps for a poison-free low ULK damage scheme using a via-first dual hardmask, in accordance with the principles of the present teachings.

In particular, integrated circuit stack 157 can include a plurality of layers, e.g., a Cu/ULK layer 101, a SiCN layer 102, a ULK layer 103, and a $Si_3N_4$ or SiC layer 104. The via and trench 134 from FIG. 1G can be simultaneously etched to produce a via and trench with a desired depth and push the via to the top of the etch-stop layer SiCN layer 102. Moreover, the TEOS layer 105 shown in FIG. 1G is stripped away with during the etching of the trench and via 133.

Figure 1I:
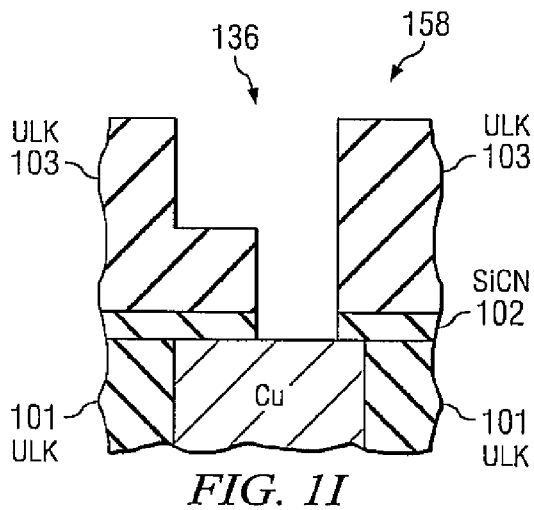

FIG. 1I shows a next formation from FIG. 1H within a series of steps for a poison-free low ULK damage scheme using a via-first dual hardmask, in accordance with the principles of the present teachings.

In particular, integrated circuit stack 158 can include a plurality of layers, e.g., a Cu/ULK layer 101, a SiCN layer 102, and a ULK layer 103. The via that makes up the via and trench 135 from FIG. 1H can be extended through the SiCN layer 102 to the top of the Cu/ULK layer 101 through an etch-stop etching procedure to produce via and trench 136. An example of an etch-stop procedure that can be used to extend a via through the SiCN layer 102 is a plasma etching. The bottom hardmask layer, SiCN layer 102, may or may not be completely removed depending on the deposited thickness.

Figure 1J:
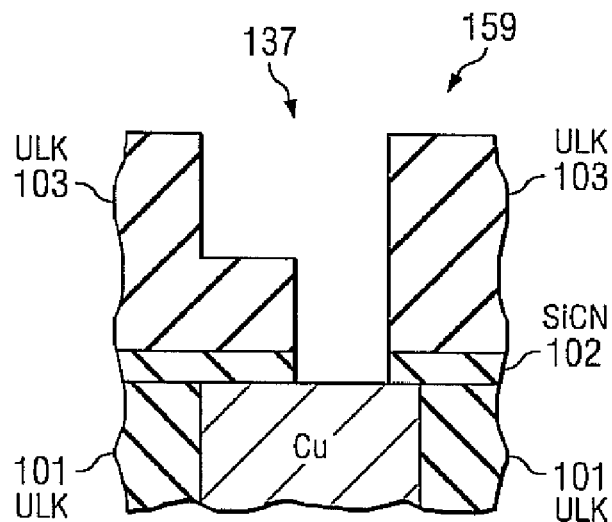

FIG. 1J shows a next formation from FIG. 1I within a series of steps for a poison-free low ULK damage scheme using a via-first dual hardmask, in accordance with the principles of the present teachings.

In particular, integrated circuit stack 159 can include a plurality of layers, e.g., a Cu/ULK layer 101, a SiCN layer 102, and a ULK layer 103. A final wet clean procedure can be performed on the integrated circuit stack 159 to remove any remaining residues.

Upon final formation of via and trench 137, a conventional metallization loop can be performed on the integrated circuit stack 159. Such a conventional metallization loop can include depositing a copper layer over the integrated circuit stack 159 including over the trench and via 137. Electrochemical deposition (ECD) can then be used to deposit the copper layer within the trench and via 137.

Figure 2:
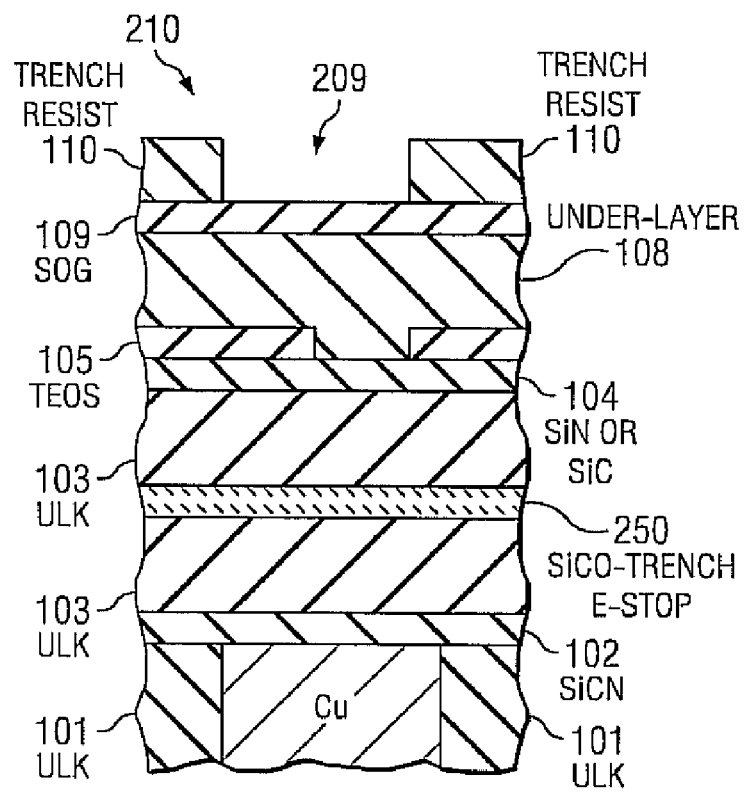
FIG. 2 shows an alternate embodiment for a poison-free low ULK damage scheme using a via-first dual hardmask to form a dual-damascene, in accordance with the principles of the present teachings.

FIG. 2 shows an alternate embodiment for a poison-free low ULK damage scheme using a via-first dual hardmask to form a dual-damascene, in accordance with the principles of the present teachings.

FIG. 2 shows a formation for a poison-free low ULK damage scheme using a via-first dual hardmask similar to that shown in FIG. 1E, but further can include a SiCO trench-stop layer 250, in accordance with the principles of the present teachings.

In particular, integrated circuit stack 210 can be formed including a plurality of layers similar to FIG. 1E, e.g., a Cu/ULK layer 101, a SiCN layer 102, a ULK layer 103, a $Si_3N_4$ or SiC layer 104, a TEOS layer 105, an under-layer 108, a SOG layer 109 and a resist layer 110. However, to control trench depth variation a SiCO trench etch-stop layer 250 can be added to the ULK layer 103 during coating. Processing of integrated circuit stack 210 is performed similarly to that as shown in FIGS. 1F-1J.

Shown for example purposes only, SiCO etch-stop layer 250 can be added to the ULK layer 103 at approximately half the distance between the SiCN layer 102 and the $Si_3N_4$ or SiC layer 104. However, placement of the SiCO trench etch-stop layer 250 can be at any point in between the SiCN layer 102 and the $Si_3N_4$ or SiC layer 104 that is appropriate to control the trench depth during etching.

A thin trench-stop layer 250, e.g., less than or equal to 100 A, allows greater control over depth control. The use of a thin trench etch-stop layer 250 has an impact on $K_{eff}$ of an approximate increase of 3%. However, trench depth variation can be reduced by approximately 50%.

Thus, a method of forming a dual-damascene structure is disclosed herein. A lower dielectric hardmask layer and an upper dielectric hardmask layer are deposited on an ultra low-k (ULK) layer. After via pattern, a first via is formed in the upper hardmask layer using selective etch between the upper hardmask and the lower hardmask. At trench pattern, tri-layer resist scheme is used to improve pattern quality and etch resist margin. With the lower hardmask covering the ULK film, the lower hardmask prevents interaction of amine sources from etch-stop layer with resist to eliminate resist poisoning. During trench etch, trench and via are formed simultaneously, reducing ULK damage due to less exposure of ULK film to ash process. The method according to the teachings disclosed herein results in a robust via and trench patterning, minimizing ULK damage and simplifying the process flow.

The via-first hardmask scheme disclosed herein provides advantages over the conventional use of a trench-first hardmask scheme. Due to the very small open area at a via, topography is improved. Moreover, there is less issue with resist thinning and depth-of-focus during trench patterning.

The ULK layer disclosed herein can be a low-k or a ULK dielectric film selected from the group consisting of inorganic films (such as OSG, porous HSQ, xerogels), organic films (such as SiLK) and their porous derivatives.

For via patterning with very thin resist, e.g., 1500 A, a single-layer resist can be used due to a very shallow via etch. This is a significant cost savings as compared to tri-layer resist via patterning.

Moreover, in accordance with the teachings herein resist poisoning is eliminated with the dual hardmask scheme disclosed herein. Double etch-stop layers, e.g., SiCO on SiCN, are no longer needed. A single etch-stop layer, e.g., SiCN, can be used to reduce cost and cycle time for film deposition.

The via-first hardmask scheme disclosed herein minimizes ULK ash damage by avoiding ash steps after full via and trench etch.

Moreover, the dielectric hardmask scheme disclosed herein provides benefits over the conventional use of a metal hardmask scheme by eliminating the need for separate metal deposition and etch tools.

Moreover, a benefit of the disclosed trench patterning is that etcher throughput is significantly increased due to the simultaneous via and trench etch.

While the teachings have been illustrated with respect to one or more implementations, alterations and/or modifications can be made to the illustrated examples without departing from the spirit and scope of the appended claims. In addition, while a particular feature of the teachings may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the teachings disclosed herein will be apparent to those skilled in the art from consideration of the specification and practice of the teachings disclosed herein. It is intended that the specification and examples be considered as exemplary only, with a true scope and spirit of the teachings being indicated by the following claims.

What is claimed is:

1. A method of forming a dual-damascene structure in the manufacture of an integrated circuit, comprising:
   providing a conductor in a low-k dielectric layer;
   forming a dielectric barrier layer over the conductor and low-k dielectric layer as a via etch-stop layer;
   forming a low-k interlevel dielectric layer over the dielectric barrier layer;
   forming a lower hardmask layer over the interlevel dielectric layer;
   forming an upper hardmask layer over the lower hardmask layer, the lower hardmask layer being more etch selective than the upper hardmask layer;
   forming an antireflective coating over the upper hardmask layer;
   forming and patterning a first resist layer over the antireflective coating layer, the patterning defining a via opening etch profile;
   etching the antireflective coating and upper hardmask layers through the via opening etch profile of the patterned first resist layer to define a via opening down to the lower hardmask layer;
   removing the patterned first resist layer and antireflective coating after forming the via opening down to the lower hardmask layer;
   forming an underlayer over the lower hardmask layer and within the via opening after removing the first resist layer and antireflective coating;
   forming a spin-on glass layer over the underlayer;
   forming and patterning a second resist layer over the spin-on glass layer, the patterning defining a trench opening etch profile over the via opening;
   etching the spin-on glass layer, the underlayer, the lower hardmask layer, and the interlevel dielectric layer through the trench opening etch profile of the patterned second resist layer to form a trench opening; the etch operating on the via opening in the upper hardmask layer to extend the via opening below the trench opening;
   removing the patterned second resist layer, the spin-on glass layer, and the underlayer after forming the trench opening;
   removing the upper hardmask layer and further etching the interlevel dielectric layer through the lower hardmask layer to deepen the trench opening within the interlevel dielectric layer and to further extend the via opening down to the dielectric barrier layer; and
   removing the lower hardmask layer and etching the dielectric barrier layer through the extended via opening, to further extend the via opening down to the conductor.

2. The method according to claim 1, wherein the dielectric barrier layer is SiCN.

3. The method according to claim 1, wherein the low-k interlevel dielectric layer is at least one of a low-k dielectric film and ultra low-k dielectric film selected from the group comprising inorganic films, organic films, and porous derivatives of one of inorganic films and organic films.

4. The method according to claim 1, wherein the lower hardmask is comprised of SiC.

5. The according to claim 1, wherein the upper hardmask is comprised of TEOS.

6. The method according to claim 1, wherein the lower hardmask is comprised of $Si_3N_4$.

7. The method according to claim 1, wherein the conductor includes Cu.

8. The method according to claim 1, wherein at least one of the dielectric barrier layer and the via etch-stop layer is SiCN.

9. The method according to claim 1, wherein forming the interlevel dielectric layer comprises forming a first portion of the interlevel dielectric layer over the dielectric barrier layer; forming a trench etch-stop layer over the first portion of the interlevel dielectric layer; and forming a second portion of the interlevel dielectric layer over the trench etch-stop layer.

10. The method according to claim 9, wherein the trench etch-stop layer comprises SiCO.

11. The method according to claim 9, wherein the first and second portions of the interlevel dielectric layer can be at least one of a low-k dielectric film and an ultra low-k dielectric film selected from the group consisting of inorganic films, organic films and porous derivatives of one of inorganic films and organic films.

12. The method according to claim 9, wherein the first and second portions of the interlevel dielectric layer are different films.

13. The method according to claim 9, wherein the trench etch-stop layer comprises SiCO and has a thickness of approximately 3 nm to 15 nm.

14. The method according to claim 9, wherein the lower hardmask is SiC.

15. The method according to claim 9, wherein the upper hardmask is TEOS.

16. The method according to claim 9, wherein the lower hardmask is $Si_3N_4$.

17. The method according to claim 9, wherein the conductor includes Cu.

18. The method according to claim 1, wherein the conductor includes copper; the dielectric barrier layer is SiCN; the interlevel dielectric layer comprises an ultra low-k dielectric material; the lower hardmask layer comprises SiN or SiC; and the upper hardmask layer comprises TEOS.

19. A method of forming a dual-damascene structure in the manufacture of an integrated circuit, comprising:
   providing a Cu conductor in a low-k dielectric layer having k<2.5;
   forming a dielectric SiCN barrier layer over the Cu conductor and low-k dielectric layer as a via etch-stop layer;

forming a low-k interlevel dielectric layer having k<2.5 over the dielectric SiCN barrier layer;

forming a $Si_3N_4$ or SiC lower hardmask layer over the interlevel dielectric layer;

forming a TEOS upper hardmask layer over the lower hardmask layer, the lower hardmask layer being more etch selective than the upper hardmask layer;

forming a BARC antireflective coating over the upper hardmask layer;

forming and patterning a first resist layer over the antireflective coating layer, the patterning defining a via opening etch profile;

etching the antireflective coating and upper hardmask layers through the via opening etch profile patterned first resist layer to define a via opening down to the lower hardmask layer;

removing the patterned first resist layer and antireflective coating using an ash process, after forming the via opening down to the lower hardmask layer;

forming an underlayer over the lower hardmask layer and within the via opening after removing the first resist layer and antireflective coating;

forming a spin-on glass layer over the underlayer;

forming and patterning a second resist layer over the spin-on glass layer, the patterning defining a trench opening etch profile over the via opening;

etching the spin-on glass layer, the underlayer, the lower hardmask layer, and the interlevel dielectric layer through the trench opening etch profile of the patterned second resist layer to form a trench opening; the etch operating on the via opening in the upper hardmask layer to extend the via opening below the trench opening;

removing the patterned second resist layer, the spin-on glass layer, and the underlayer after forming the trench opening;

removing the upper hardmask layer and further etching the interlevel dielectric layer through the trench opening of the lower hardmask layer to deepen the trench opening within the interval dielectric layer and to further extend the via opening down to the dielectric barrier layer; and removing the lower hardmask layer and etching the dielectric barrier layer through the extended via opening, to further extend the via opening down to the conductor.

* * * * *